(12) United States Patent
Akutsu et al.

(10) Patent No.: US 7,030,964 B2
(45) Date of Patent: Apr. 18, 2006

(54) STAGE SYSTEM, EXPOSURE APPARATUS, AND DEVICE MANUFACTURING METHOD

(75) Inventors: Kotaro Akutsu, Soka (JP); Nobushige Korenaga, Utsunomiya (JP); Mitsuru Inoue, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 56 days.

(21) Appl. No.: 10/862,383

(22) Filed: Jun. 8, 2004

(65) Prior Publication Data

US 2005/0018166 A1    Jan. 27, 2005

(30) Foreign Application Priority Data

Jun. 10, 2003  (JP)  .............................. 2003-165512

(51) Int. Cl.
*G03B 27/42* (2006.01)
*G03B 27/58* (2006.01)
*H01J 37/08* (2006.01)
*H02K 41/00* (2006.01)

(52) U.S. Cl. ............... 355/53; 355/72; 250/492.22; 310/12

(58) Field of Classification Search ............... 355/53, 355/72; 250/491.1, 492.22; 310/12; 318/135; 378/34
See application file for complete search history.

(56) References Cited

U.S. PATENT DOCUMENTS

| | | | |
|---|---|---|---|
| 5,467,720 A | 11/1995 | Korenaga et al. | 108/20 |
| 5,684,856 A * | 11/1997 | Itoh et al. | 378/34 |
| 5,717,482 A | 2/1998 | Akutsu et al. | 355/53 |
| 5,726,548 A | 3/1998 | Chiba et al. | 318/625 |
| 5,858,587 A | 1/1999 | Yamane et al. | 430/22 |
| 5,864,142 A | 1/1999 | Muraki et al. | 250/491.1 |
| 6,008,882 A | 12/1999 | Ito et al. | 355/53 |
| 6,359,677 B1 | 3/2002 | Itoh et al. | 355/53 |
| 6,414,742 B1 | 7/2002 | Korenaga et al. | 355/53 |
| 6,644,855 B1 | 11/2003 | Sakino et al. | 384/9 |
| 6,717,653 B1 | 4/2004 | Iwamoto et al. | 355/72 |
| 2002/0018195 A1 | 2/2002 | Iwamoto et al. | 355/72 |
| 2002/0118897 A1 | 8/2002 | Sakino et al. | 384/12 |
| 2004/0012765 A1 | 1/2004 | Akutsu et al. | 355/53 |
| 2004/0041101 A1 | 3/2004 | Akutsu | 250/491.1 |

FOREIGN PATENT DOCUMENTS

| | | |
|---|---|---|
| JP | 9-330867 | 1/2002 |
| JP | 2002-8971 | 1/2002 |
| JP | 2002-252166 | 9/2002 |

* cited by examiner

*Primary Examiner*—Alan Mathews
(74) *Attorney, Agent, or Firm*—Fitzpatrick, Cella, Harper & Scinto

(57) ABSTRACT

A stage system including a first fixed guide having a first guide surface being parallel to a first direction and a second direction being orthogonal to the first direction, a first movable guide to be guided by the first fixed guide and having three freedoms of straight motions in the first and second directions and a motion in a rotational direction about a third direction being orthogonal to the first and second directions, the first movable guide extending in the second direction, a second fixed guide having a second guide surface being parallel to the first and second directions, a second movable guide to be guided by the second fixed guide and having three freedoms of straight motions in the first and second directions and a motion in a rotational direction about the third direction, the second movable guide having a second guide extending in the first direction, and a movable member to be guided in the first and second directions by the first and second movable guides.

15 Claims, 14 Drawing Sheets

STAGE SYSTEM, EXPOSURE APPARATUS, AND DEVICE MANUFACTURING METHOD

FIELD OF THE INVENTION AND RELATED ART

This invention relates to a stage system to be used in various measuring instruments, or in a projection exposure apparatus, for a semiconductor lithography process, for moving and positioning a substrate, such as a wafer, at a high speed and with a high precision. The stage system of the present invention is best suited for a stage system particularly to be used in an electron beam exposure apparatus, in which an electron beam is used to perform pattern drawing for direct patterning of a wafer or reticle exposure, or in an EUV (extreme ultraviolet) exposure apparatus using EUV light as exposure light in which the stage system is used in a vacuum ambience.

The manufacture of devices such as semiconductor devices, for example, is based on lithography technology in which various patterns formed on a mask are transferred to a wafer in a reduced scale, by use of light. Extremely high precision is required in relation to the mask pattern to be used in such lithography technology, and an electron beam exposure apparatus is used to make such a mask. Further, an electron beam exposure apparatus is used also in a case wherein a pattern is to be directly formed on a wafer without using a mask.

As regards such an electron beam exposure apparatus, there is a point beam type apparatus wherein an electron beam to be used is shaped into a spot-like shape, and a variable rectangle-beam type apparatus wherein an electron beam has a rectangular section of various size, for example. In these types of exposure apparatus, however, generally, the apparatus comprises an electron gun unit for producing an electron beam, an electron optical system for directing the produced electron beam to a sample, a stage system for scanningly moving the whole surface of the sample with respect to the electron beam, and an objective deflector for positioning the electron beam upon the sample very precisely.

The region that can be positioned by use of an objective deflector has only a small size of about a few millimeters, to suppress the aberration of the electron optical system as much as possible. To the contrary, as regards the size of the sample, for a silicon wafer, it is about 200–300 mm in diameter, and for a glass substrate to be used as a mask, it is about 150 mm square. So, the electron beam exposure apparatuses include a stage system by which the whole surface of the sample can be scanned with the electron beam.

In electron beam exposure apparatuses, since the positioning response of the electron beam is extraordinarily high, generally, they use a system in which the attitude of the stage or a positional deviation thereof is measured and the measured value is fed back to the positioning of the electron beam through the deflector, rather than attempting to improve the mechanical control characteristic of the stage. Also, since the stage is disposed in a vacuum chamber and, furthermore, there is a restriction that a change in a magnetic field that may influence the positioning precision of the electron beam must be avoided, generally, the stage is disposed by use of a limited element of a contact type, such as rolling guides or ball screw actuators.

Such contact type elements involve a problem of lubrication and dust creation, for example. Japanese Laid-Open Patent Application No. 2002-252166 shows a countermeasure therefor, and FIG. 10 illustrates it, that is, a stage having two freedoms of movement in a planar direction, using vacuum air guides and linear motors. In the example of FIG. 10, very smooth acceleration can be accomplished and, yet, with respect to the positioning direction, external disturbance from the guide is very small. In the illustrated example, the stage comprises an X slider, a Y slider and an X-Y slider, wherein the X slider and the Y slider are confined with respect to rotation about the Z axis, by means of radial bearings.

FIG. 11 shows an example of a stage, to be used in an atmosphere, corresponding to a stage disclosed in Japanese Laid-Open Patent Application No. 2002-8971. In the example of FIG. 11, like the example of FIG. 10, the stage comprises an X slider (X guide bar 28), a Y slider (Y guide bar 29), and an X-Y slider, but the X slider and the Y slider are not confined with respect to rotation about the Z axis.

As regards the election beam exposure apparatus, there is a known example disclosed in Japanese Laid-Open Patent Application No. H09-330867. In the apparatus of this document, a plurality of electron beams are projected upon the surface of a sample along design coordinates and the electron beams are deflected along the design coordinates to thereby scan the sample surface. Additionally, in accordance with a pattern to be drawn, the electron beams are individually turned on and off to thereby draw the pattern. In such a multiple electron-beam type exposure apparatus, a desired pattern can be drawn by use of plural electron beams, and thus, the throughput can be improved.

FIG. 12 illustrates a general structure of a multiple electron-beam type exposure apparatus. Denoted at 501a, 501b, and 501c are electron guns by which a plurality of electron beams can be individually turned on and off. Denoted at 100 is a reduction electron optical system for reducing and projecting the electron beams from the electron guns 501a, 501b and 501c, onto a wafer 305. Denoted at 306 is a deflector for scanning the plural electron beams projected to the wafer 305.

FIG. 13 illustrates the action as a wafer is scanned with plural electron beams, in the exposure apparatus of FIG. 12. White small circles depict beam reference positions BS1, BS2 and BS3 whereat the electron beams are incident, as they are not deflected by the deflector 306. These beam reference positions BS1–BS3 are placed along a design orthogonal coordinate system (Xs, Ys).

On the other hand, the electron beams are scanned (scanningly deflected) also along a design orthogonal coordinate system (Xs, Ys) while taking the beam reference positions as a reference, to scan associated exposure fields EF1, EF2 and EF3, respectively. In this stage, the stage which carries the wafer 350 thereon is scanningly moved mainly in the Y direction, as denoted at 200 in FIG. 13, to perform sequential exposures of zones of the wafer.

SUMMARY OF THE INVENTION

Enlargement of the wafer diameter has been required in lithography, and thus, the stroke of the apparatus should be enlarged. In the example of FIG. 10, there is a difficulty in setting the orthogonality of confining axes for confining each of the X and Y sliders at opposite sides. This leads to a difficulty in improvement of the precision or enlargement of the stroke.

In the example of FIG. 11, on the other hand, if there is a tilt of a base table, for example, it may cause unwanted motion in the X or Y direction. Furthermore, the arrangement itself cannot be used in a vacuum ambience.

It is accordingly an object of the present invention to provide a high-precision stage system that can meet enlargement of the stroke.

In accordance with an aspect of the present invention, to achieve this object, there is provided a stage system, comprising a first fixed guide having a first guide surface being parallel to or approximately parallel to a first direction and a second direction being orthogonal to or approximately orthogonal to the first direction, a first movable guide to be guided by the first fixed guide and having three freedoms of movement of straight motions in the first and second directions and a motion in a rotational direction about a third direction being orthogonal to or approximately orthogonal to the first and second directions, the first movable guide having a first guide extending in the second direction, a second fixed guide having a second guide surface being parallel to or approximately parallel to the first and second directions, a second movable guide to be guided by the second fixed guide and having three freedoms of movement of straight motions in the first and second directions and a motion in a rotational direction about the third direction, the second movable guide having a second guide extending in the first direction, and a central movable member to be guided in the first and second directions by means of the first and second guides.

In accordance with another aspect of the present invention, there is provided a stage system comprising a first fixed guide having a first guide surface being parallel to or approximately parallel to a first direction and a second direction being orthogonal to or approximately orthogonal to the first direction, a first movable guide to be guided by the first fixed guide and having a first guide extending in the second direction, a second fixed guide having a second guide surface being parallel to or approximately parallel to the first and second directions, a second movable guide to be guided by the second fixed guide and having a second guide extending in the first direction, a third fixed guide having a third guide surface being parallel to or approximately parallel to the first and second guide surfaces, and a central movable member to be guided in the first and second directions by means of the first and second guides, and also to be guided by the third fixed guide in a third direction being orthogonal to or approximately orthogonal to the first and second directions, wherein the central movable member is attracted to the third fixed guide by means of a permanent magnet unit having a magnetic shield.

In accordance with the present invention, a high-precision stage system that can meet enlargement of the stroke can be accomplished. Further, since the fixed guide (guide surface) is divided into plural guides, even if a magnetic preload is used, magnets can be magnetically shielded effectively. Thus, the stage system can be well incorporated into an electron beam exposure apparatus.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
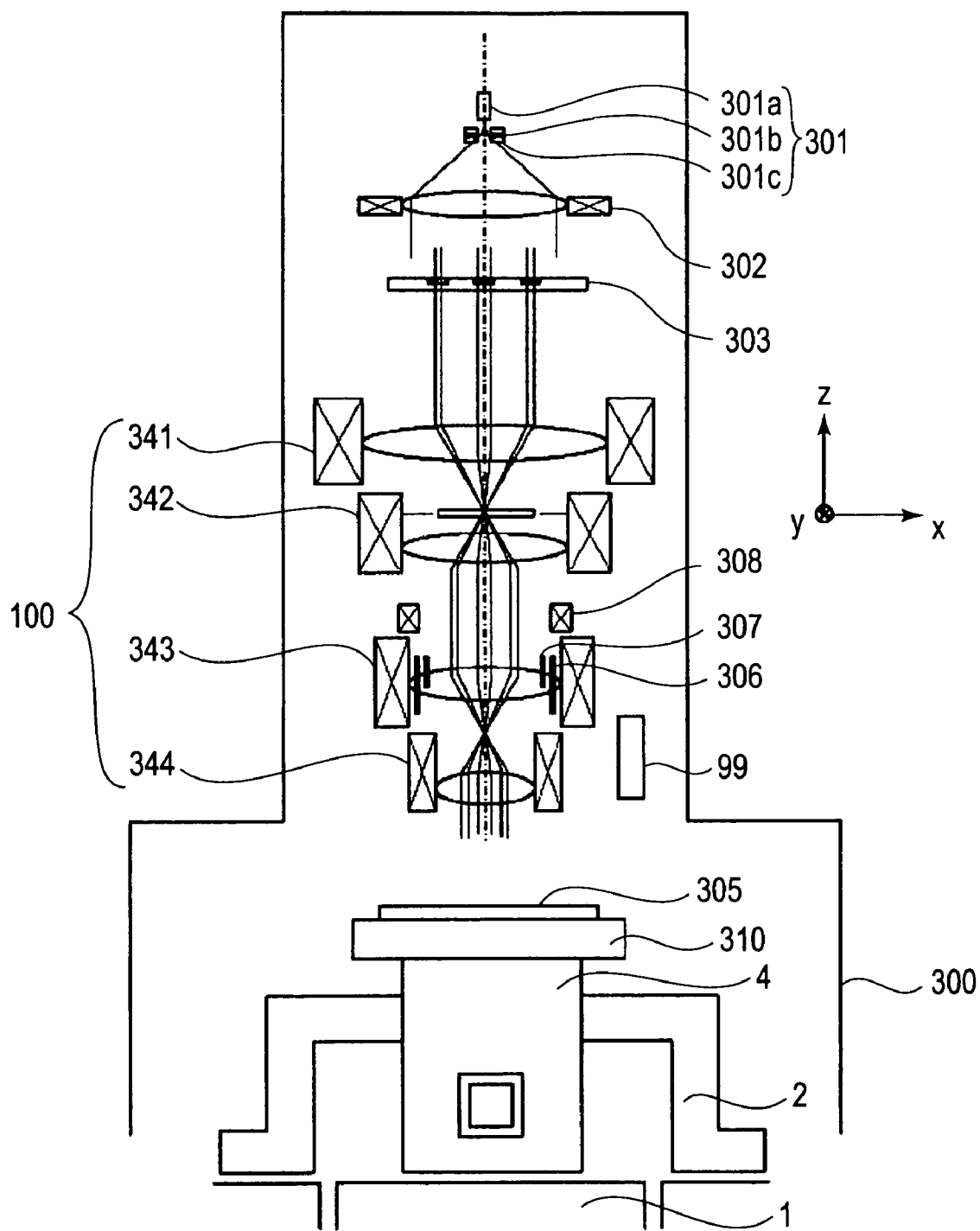
FIG. 1 is a schematic view of a main portion of an electron beam exposure apparatus according to an embodiment of the present invention.

The present invention may take the following preferred forms.

That is, a stage system in one preferred form of the present invention comprises a first fixed guide (1a, 1c: reference numerals are those used in the embodiments to be described later), having a plane (first guide surface) being parallel to or approximately parallel to a first direction (X direction) and a second direction (Y direction) being orthogonal to or approximately orthogonal to the first direction, a first movable guide (3) to be guided by the first fixed guide and having three freedoms of movement, including a motion in a rotational direction about a third direction being orthogonal to or approximately orthogonal to the first and second directions (the first movable guide having a guide 3f extending in the Y direction), a second fixed guide (1b, 1d) having a plane (second guide surface) being parallel to or approximately parallel to the first and second directions, a second movable guide (2) to be guided by the second fixed guide and having three freedoms of movement in the first, second and third directions (the second movable guide having a guide 2f extending in the X direction, and a central movable member (4) to be guided in the X and Y directions by means of the Y guide 3f and X guide 2f.

Preferably, the stage system may further comprise (i) a first actuator group (34m) for driving the first movable guide (3) in three-freedom of movement directions (the first actuator group including a first X actuator for driving the first movable guide in the X direction with a relatively long stroke, and a first Y actuator for driving the first movable guide in the second direction with a relatively short stroke), and (ii) a second actuator group (24m) for driving the second movable guide (2) at least in two-freedom of movement directions of X and Y (the second actuator group including a second Y actuator for driving the second movable guide in the Y direction with a relatively long stroke, and a second X actuator for driving the second movable guide in the X direction with a relatively short stroke).

Moreover, preferably, the stage system may further comprise a third fixed guide (1) having a plane extending in the X and Y directions. The central movable member (4) may be guided by the third fixed guide. The upper surfaces of the first, second and third fixed guides, functioning as a guide surface, may be parallel to or approximately parallel to each other. These guides may comprise a static pressure bearing. The actuators may comprise a non-contact linear motor. On that occasion, the first X actuator may use a Y-direction magnetic flux component of a permanent magnet 134 mag group (X movable element), while the first Y actuator may use an X-direction magnetic flux component of the permanent magnet group. The second Y actuator may use an X-direction magnetic flux component of a permanent magnet group (Y movable element), while the second X actuator may use a Y-direction magnetic flux component of the permanent magnet group.

Moreover, the stage system may preferably further comprise a third fixed guide (1) having a plane in the X and Y directions, and the central movable member (4) may be guided by the third fixed guide. A first magnet (39) may apply a preload to the first movable guide (3) with respect to the first fixed guide (1a, 1c), and a second magnet (29) may apply a preload to the second movable guide (2) with respect to the second fixed guide (1b, 1d). A third magnet (49) may apply a preload to the central movable member (4) with respect to the third fixed guide (1). The first, second and third magnets may have magnetic shields (39sh, 29sh, 49sh), respectively.

When the magnetic resistance of a magnetic path defined inside each magnetic shield and the first, second and third magnets is Re, and the magnetic resistance of a magnetic path defined interactively between the first, second and third magnets is Rr, there may be a relation Re<Rr.

Preferably, the actuators may comprise non-contact linear motors, having a magnetic shield. The first Y actuator or the second X actuator may comprise an electromagnet.

A stage system in a second preferred form of the present invention comprises a first fixed guide (1a, 1c) having a plane (first guide surface) being parallel to or approximately parallel to a first direction (X direction) and a second direction (Y direction) being orthogonal to or approximately orthogonal to the first direction, a first movable guide (3) to be guided by the first fixed guide (the first movable guide having a Y guide 3f extending in the Y direction, a second fixed guide (1b, 1d) having a plane (second guide surface) being parallel to or approximately parallel to the first and second directions, a second movable guide (2) to be guided by the second fixed guide (the second movable guide having an X guide 2f extending in the X direction), a third fixed guide (1) having a third guide surface being parallel to or approximately parallel to the first and second guide surfaces, and a central movable member (4) to be guided in the X and Y directions by means of the Y guide (3f) and the X guide (2f), and also to be guided by the third fixed guide (1) in a third direction being orthogonal to or approximately orthogonal to the first and second direction, wherein the central movable member is attracted to the third fixed guide by means of a permanent magnet (1) unit having a magnetic shield.

Preferred embodiments of the present invention will now be described with reference to the attached drawings.

FIG. 1 is a schematic view of a main portion of an electron beam exposure apparatus according to an embodiment of the present invention. Denoted in FIG. 1 at 300 is a vacuum sample chamber, and denoted at 301 is an electron gun having a cathode 301a, a grid 301b and an anode 301c.

Electrons emitted from the cathode 301a produce a crossover image between the grid 301b and the anode 301c (hereinafter, the crossover image will be referred to as a light source).

Electrons emitted from this light source are formed into an approximately parallel electron beam by means of a condenser lens 302 having a front focal point position placed at the light source position. The approximately parallel electron beam is then incident on an element electron optical system array 303. The element electron optical system array 303 includes a plurality of element electron optical systems each comprising a blanking electrode, an aperture and an electron lens. These element electron optical systems are arrayed along a direction perpendicular to the optical axis of a reduction electron optical system 100, which is parallel to the Z axis. Details of the element electron optical system array 303 will be described later.

The element electron optical system array 303 functions to produce a plurality of intermediate images of the light source, and these intermediate images are projected in a reduced scale by the reduction electron optical system 100, whereby light source images are formed upon a wafer 305. Here, the components of the element electron optical system array 303 are set so that the spacing of the light source images formed on the wafer 305 has a size corresponding to a multiple, by an integral number, of the size of the light source. Further, the element electron optical system 303 functions to assure that the positions of the light source images with respect to the optical axis directions are different in accordance with the field curvature of the reduction electron optical system 100. Also, the element electron optical system functions to correct aberration to be produced as the intermediate images are projected on the wafer 305 by the reduction electron optical system 100.

The reduction electron optical system 100 includes two-stage type symmetric magnetic tablets, comprising a first projection lens (341, 343) and a second projection lens (342, 344). When the focal length of the first projection lens (341, 343) is f1 while the focal length of the second projection lens (342, 44) is f2, the distance between these two lenses is equal to f1+f2.

The object point on the optical axis is at the focal point position of the first projection lens (341, 343), and the image point thereof is focused on the focal point of the second projection lens (342, 344). This image is reduced at −f2/f1. Also, since the magnetic fields of these two lenses are determined so that they act in mutually opposite directions, theoretically, except five aberrations of spherical aberration, isotropic astigmatism, isotropic coma aberration, field curvature aberration, and longitudinal chromatic aberration, the remaining Seidel's aberration and chromatic aberration concerning rotation and magnification can be cancelled.

Denoted at 306 is a deflector for deflecting plural electron beams from the element electron optical system array 303 so as to shift plural light source images upon the wafer 305 in the X and Y directions by the same displacement amount. While not shown in the drawing, the deflector 306 comprises a main deflector to be used when the deflection width is wide, and a sub-deflector to be used when the deflection width is narrow. The main deflector is an electromagnetic type deflector, while the sub-deflector is an electrostatic type deflector.

Denoted at 307 is a dynamic focus coil for correcting a deviation of the focus position of the light source image, based on deflection aberration to be produced when the deflector 306 is operated. Denoted at 308 is a dynamic coil, which serves, like the dynamic focus coil 307, to correct astigmatism of deflection aberration to be produced by the deflection. Denoted at 99 is an alignment scope having an off-axis management, for detecting a mark already formed on the wafer.

Denoted at 310 is a top stage for carrying a wafer 305 thereon. For observation of the whole surface of the wafer 305 through the alignment scope 99, the top stage 310 should have a stroke corresponding to the wafer diameter, just underneath the alignment scope 99.

Denoted at 4 is an X-Y slider for carrying the top stage 310 thereon and being movable in the X and Y directions, which are orthogonal to the optical axis (Z axis). The X-Y slider will be explained in greater detail, in conjunction with FIG. 2. The X-Y slider 4 comprises an X-Y slider-(y) 41 and an X-Y slider-(x) 42. At the bottom of the X-Y slider-(y) 41, there is a vacuum-proof bearing 43 disposed opposed to the top face 1f of a stage base 1. Also, inside the side wall of the X-Y slider-(y) 41, there is a similar vacuum-proof bearing 44 disposed to sandwich a Y guide 3f.

Figure 3:
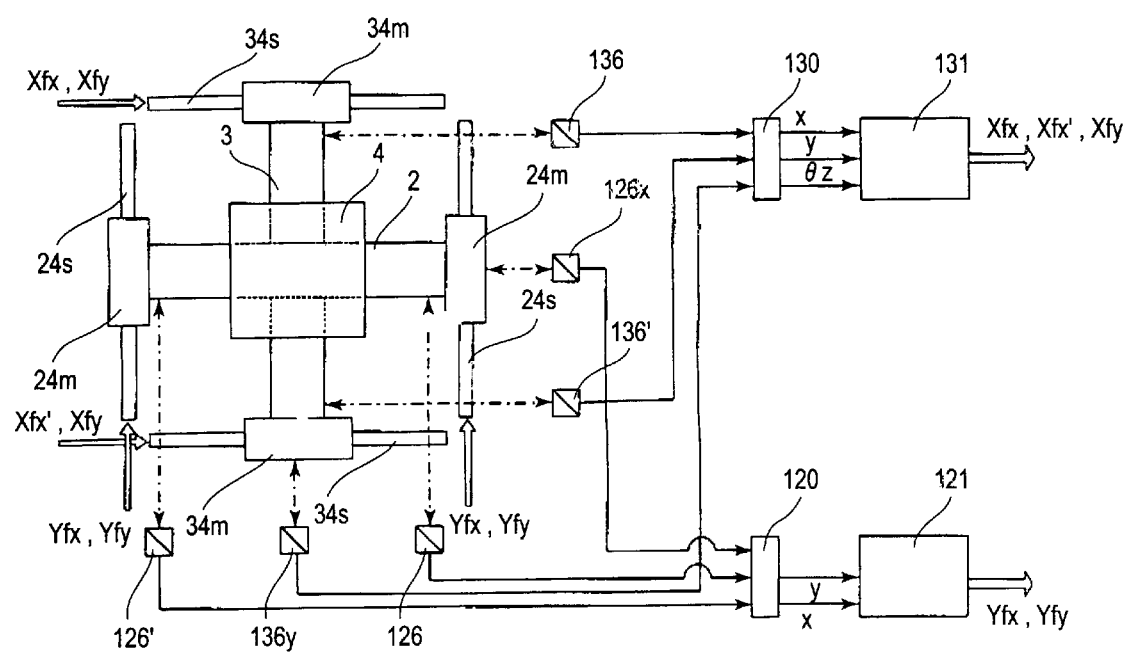
FIG. 3 is a diagram for explaining a stage control system of the stage system of the FIG. 2 example.

Further, inside the side wall of the X-Y slider-(x) 42, there is a similar vacuum-proof bearing 45 disposed to sandwich an X guide 2f. The Y guide 3f is formed at opposite side walls of the beam 32 (providing X slider 3), in the lengthwise direction. The X guide 2f is formed at the opposite side walls of a Y beam (providing Y slider 2), in the lengthwise direction. The X slider 3 having the Y guide 3f and the Y slider 2 having the X guide 2f are formed in a grid-like shape as shown in FIG. 3.

When the X-Y slider 4 is to be moved in the X direction, the X slider 3 is moved in the X direction by which it can be moved smoothly along the X guide 2f and the stage base top face 1f. When the X-Y slider 4 is to be moved in the Y direction, the Y slider 2 is moved in the Y direction by which it can be moved smoothly along the Y guide 3f and the stage base top face 1f.

The Y slider 2 will now be explained. The Y slider 2 has a Y beam 22 including the X guide 2f, as well as a Y foot 21 and a Y foot 21' disposed on the opposite side with respect to the X direction. At the bottom of the Y foot 21 (21'), there is a vacuum-proof bearing 23 disposed opposed to the top face of a beam base 1b (1d).

The top face of the beam base 1b (1d) is parallel to or approximately parallel to the stage base top face 1f. The Y slider 2 can move smoothly in the Y direction by a required stroke, within the range of the top face of the beam base 1b (1d), and also it can move smoothly in the direction and a rotational direction about the Z axis (hereinafter, "Z-axis rotational direction"). Thus, the Y slider 2 can move with a long stroke in the Y direction and with a short stroke in the X direction. Thus, adding the Z-axis rotational direction, it can move with three freedoms of movement.

Also, there are linear motor movable elements 24m disposed at the opposite sides with respect to the X direction, for driving the Y slider 2 in the Y direction. Each linear motor movable element 24m contains a permanent magnet therein, and a magnetic shield cover is mounted thereon to prevent leakage of magnetic field into the stage space. A linear motor for moving the Y slider 2 in the X direction is also housed in the movable element 24m. Details will be described later, with reference to FIG. 4.

The Y foot 21 is provided with a reflection mirror 26 for measuring the position in the Y direction and a reflection mirror 26x for measuring the position in the X direction, while the Y foot 21' is provided with a reflection mirror 26' for measuring the position in the Y direction. Thus, by use of interferometer systems 126, 126' and 126x, the position (x, y, θz) of the Y slider 2 in the directions of X, Y and Z-axis rotation can be measured.

Similarly, the X slider 3 will now be described. The X slider 3 includes an X beam 32 having the Y guide 3f, and an X foot 31 and an X foot 31' disposed on opposite sides with respect to the Y direction. At the bottom of the X foot 31 (31'), there is a vacuum-proof bearing 33 disposed opposed to the top face of a beam base 1a (1c).

The top face of the beam base 1a (1c) is parallel to or approximately parallel to the stage base top face 1f. The X slider can move smoothly in the X direction by a required stroke, within the range of the top face of the beam base 1a (1c), and also it can move smoothly in the Y direction and the Z-axis rotational direction. Thus, the X slider 3 can move with a long stroke in the X direction and with a short stroke in the Y direction. Thus, adding the Z-axis rotational direction, it can move with three freedoms of movement. Also, there are linear motor movable elements 34m disposed at the opposite sides with respect to the Y direction, for driving the X slider in the X direction.

Each linear motor movable element 34m contains a permanent magnet therein, and a magnetic shield cover is mounted thereon to prevent leakage of a magnetic field into the stage space. A linear motor for moving the X slider in the Y direction is also housed in the movable element 34m.

The X foot 31 is provided with a reflection mirror 36 for measuring the position in the X direction, while the X foot 31' is provided with a reflection mirror 36y for measuring the position in the Y direction and a reflection mirror 36' for measuring the position in the X direction. Thus, by use of interferometer systems 136, 136' and 136y, the position (x, y, θz) of the X slider 3 in the directions of X, Y and Z-axis rotation can be measured.

FIG. 3 is a diagram of a control system for the X and Y sliders. The values of the interferometer systems 136, 136' and 136y corresponding to the X slider 3 are converted by an X slider computing unit 130 into the X-direction position x, Y-direction position y and Z-axis rotational direction θz of the X slider 3, and they are applied as a feedback signal to an X slider controller 131. The X slider controller 131 calculates a driver designated value (Xfx, Xfx', Xfy) and, by applying an electrical current to a coil array provided in an associated X stator 34s, driving forces Xfx and Xfx' in the X and Z-axis rotational directions, as well as a driving force Xfy in the Y direction, are produced.

Similarly, the values of the interferometer systems 126, 126' and 126x corresponding to the Y slider 2 are converted by a Y slider computing unit 120 into the X-direction position x and Y-direction position y of the Y slider 2, and they are applied as a feedback signal to a Y slider controller 121. The Y slider controller 121 calculates a driver designated value (Yfy, Yfx) and, by applying an electrical current to a coil array provided in an associated Y stator 24s, driving forces Yfy in the Y direction, as well as a driving force Yfx in the X direction, are produced. In the control system of this embodiment, the Z-axis rotation of the X slider 3 is controllably confined, while the Z-axis rotation of the Y slider 2 follows the rotation of the X slider 3.

As described above, three freedoms of movement of the X slider and two freedoms of movement of the Y slider are controllably confined, by which three freedoms of movement of the X-Y slider 4 can be controlled. Here, the X-direction position of the X-Y slider 4 can be regarded as being substantially equivalent to the X-direction position of the X slider 3, and the Y-direction position of the X-Y slider can be regarded as being substantially equivalent to the Y-direction position of the Y slider 2. Also, the Z-axis rotation thereof can be regarded as being substantially equivalent to the Z-axis rotation of the X slider 3. Measurement for these rough-motion sliders can be performed in various combinations and, as an example, the X-Y slider 4 can be measured directly by use of an interferometer.

Further, while the positional information of the Y slider 2 regarding the rotational direction is not specifically used in this embodiment as a measured value, a control may be added by using velocity information in the rotational direction.

Figure 4A:
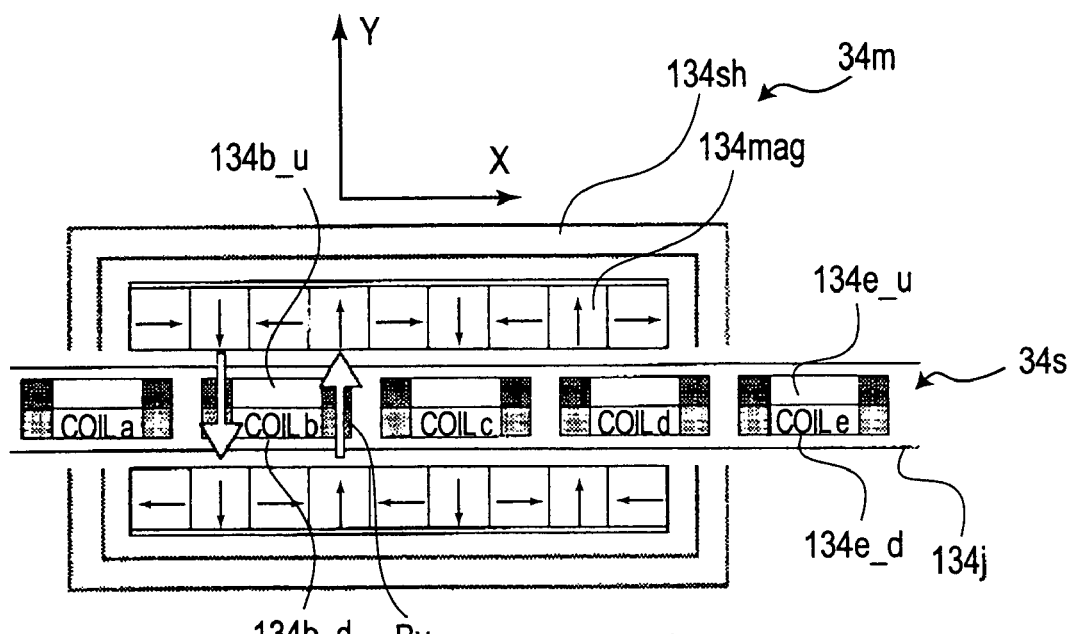
FIGS. 4A and 4B are schematic views for explaining operation of a linear motor of the stage system of FIG. 2.
Figure 4B:
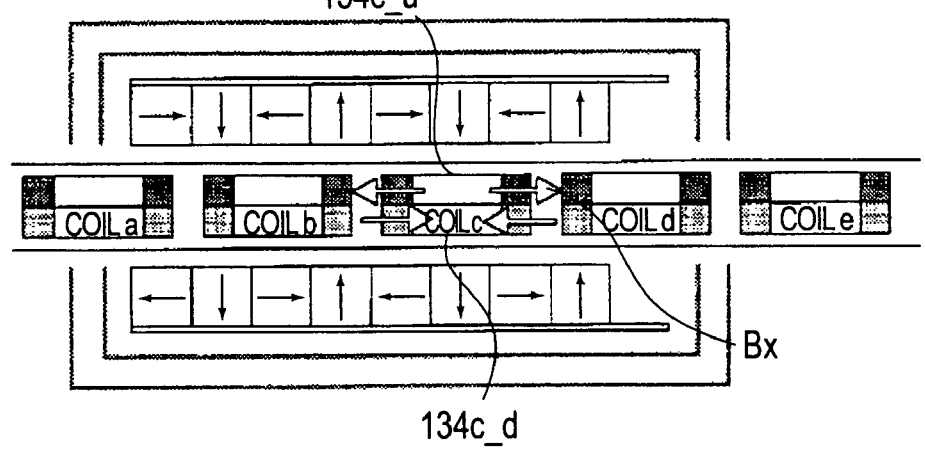

Referring now to FIGS. 4A and 4B, the linear motor to be used in the present invention will be explained while taking the linear motor 34 of the X slider 3 as an example. As described hereinbefore, the linear motor 34 has a movable element 34m and a stator 34s. The movable element 34m comprises a movable magnet 134mag and a magnetic shield 134sh. The stator 34 comprises coil arrays 134a, 134b, 134c, 134d and 134e, which are disposed along the stroke direction. Each coil has a two-layer structure. There is a jacket 134j for covering the coil arrays, to prevent the coil arrays from being bared inside the vacuum sample chamber. The movable magnet 134mag includes X-direction magnetized magnets, which are alternately sandwiched between Y-direction magnetized magnets, to provide a magnetic flux distribution near a sine wave in the coil space.

FIG. 4A illustrates a state in which a driving force acts in the X direction. A Y-direction largest magnetic flux By is being produced at the coil b. At this moment, by supplying electrical currents of the same phase to the coils 134b_u and 134b_d, due to the Lorentz's force, a force is applied to the movable element 34m in the X direction.

FIG. 4B illustrates a state in which a driving force acts in the Y direction. An X-direction largest magnetic flux Bx is being produced at the coil c, in opposite directions at the positions of the coils 134b_u and 134b_d. At this moment, by applying electrical currents of opposite phases to the coils 13b_u and 134b_d, due to the Lorentz's force, a force is applied to the movable element 34m in the Y direction. Although this force in the Y direction may be weak as compared with the force in the X direction, there does not occur a particular problem since the force in the Y direction is not used for acceleration of the X slider.

Figure 5:
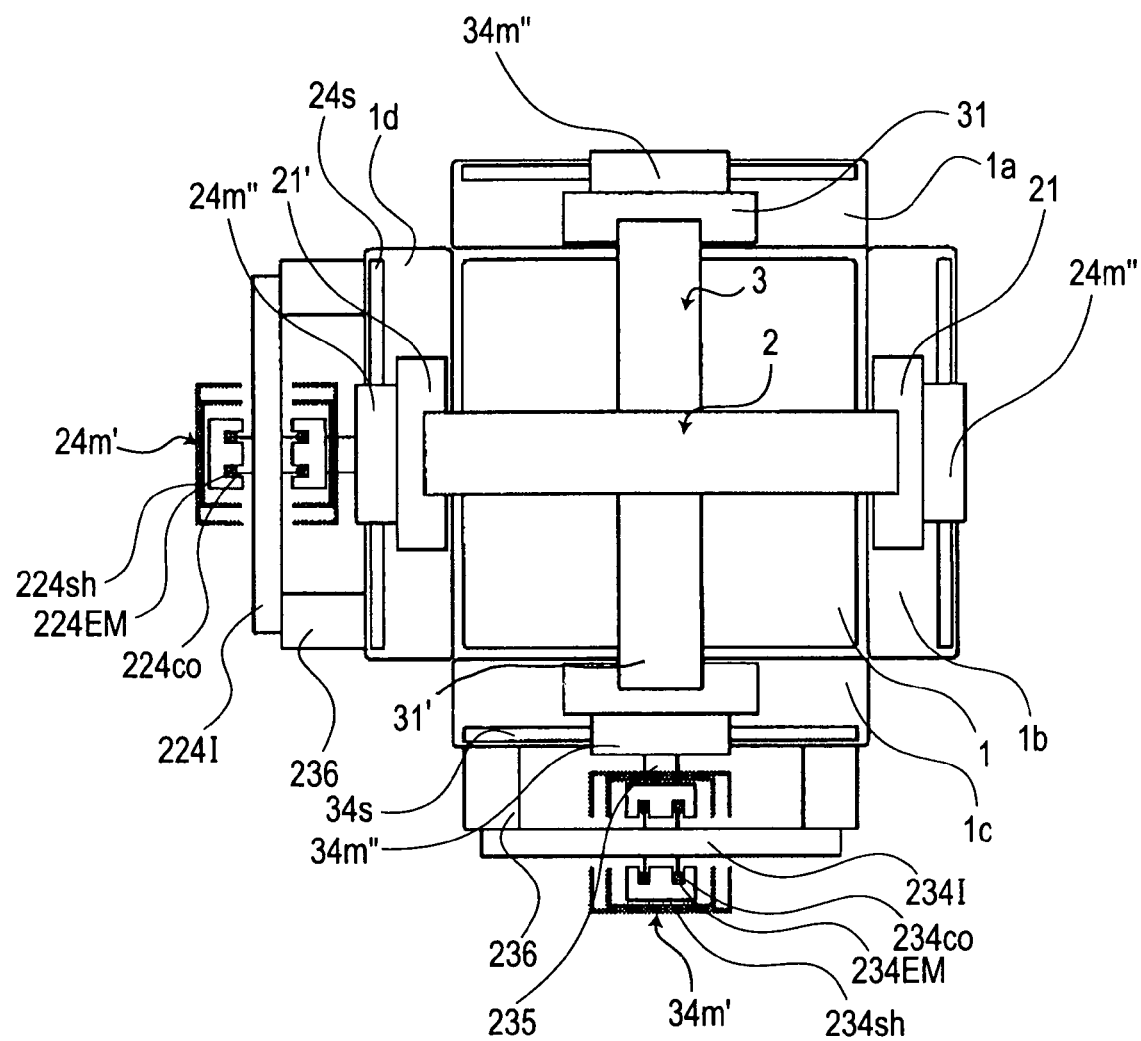
FIG. 5 is a schematic view of a stage system according to a second embodiment of the present invention.

FIG. 5 illustrates an electromagnet arrangement, as a second embodiment, for applying a driving force in the Y direction for the X slider and a driving force in the X direction for the Y slider. The X foot 31 and X foot 31' of the X slider 3 are provided with a linear motor movable element 34m'' for applying an X-direction driving force and, additionally, the X foot 31' is provided with an electromagnet unit 34m' for applying a Y-direction driving force. The electromagnet unit 34m' includes an E-shaped core 234EM, a coil 234co and a magnetic shield 234sh, at the movable side, which are fixed to the X foot 31' by a non-magnetic material 235. Also, there is a magnetic material bar 234I at the fixed side, which is fixed to the beam base 1c by a non-magnetic material 236. In the electromagnetic unit 34m', the X slider 3 can be driven in the Y direction by selectively applying and controlling a voltage to opposed coils.

The Y foot 21 and the Y foot 21' of the Y slider 2 are provided with a linear motor movable element 24m'' for applying a Y-direction driving force and, additionally, the Y foot 31' is provided with an electromagnet unit 24m' for applying an X-direction driving force. The electromagnet unit 24m' includes an E-shaped core 224EM, a coil 224co and a magnetic shield 224sh, at the movable side, which are fixed to the Y foot 21' by a non-magnetic material 235. Also, there is a magnetic material bar (I-shaped core) 224I at the fixed side, which is fixed to the beam base 1d by an I-shaped core mounting member 236 made of a non-magnetic material. In the electromagnetic unit 24m', the Y slider 2 can be driven in the X direction by selectively applying and controlling a voltage to opposed coils.

Figure 6A:
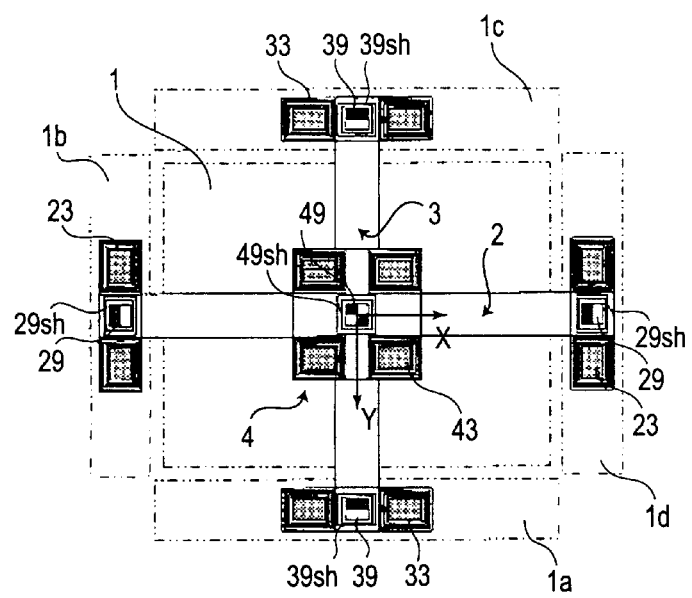
FIGS. 6A–6D are schematic views for explaining a base arrangement for supporting sliders in the stage system of FIG. 2.
Figure 6B:
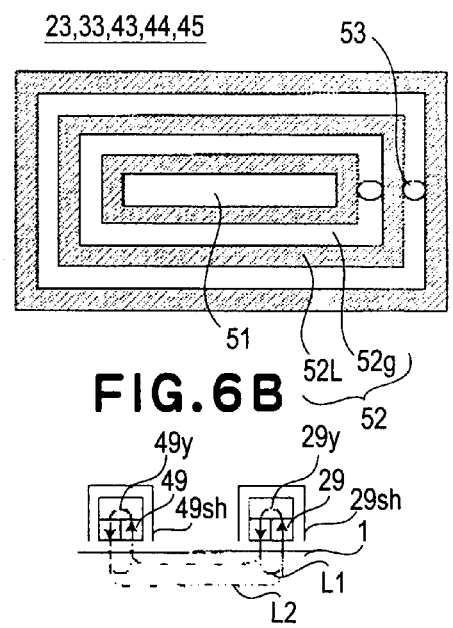

Referring now to FIGS. 6A–6D, the structure at the bottom faces of the sliders will be explained. FIG. 6A illustrates the whole structure as viewed from the bottom, for explaining the base arrangement for supporting the sliders. FIG. 6B illustrates a single bottom pad. As has been described with reference to FIG. 2, at the bottom of the X-Y slider-(y) 41, there is a vacuum-proof bearing 43 disposed opposed to the top surface 1f of the stage base 1. At the bottom of the Y foot 21 (21'), there is a vacuum-proof bearing 23 disposed opposed to the top surface of the beam base 1b (1d). At the bottom of the X foot 31 (31'), there is a vacuum-proof bearing 33 disposed opposed to the top surface of the beam base 1a (1c). Details of such pads are such as shown in FIG. 6B. Specifically, each pad comprises a static-pressure bearing portion 51 in which a fluid is discharged through a porous material, a labyrinth portion 52 for preventing leakage of the discharged fluid into the ambience, and an exhaust bore 53. The labyrinth portion includes a plurality of lands 52L and grooves 52g, for providing a fluid resistance without contact.

In order to attain a desired rigidity in a static-pressure bearing, generally, a preload is applied to the static-pressure bearing. In this embodiment, a preload is applied on the basis of an attraction force of a permanent magnet. The preload application may be made by a simple float-type preload such as a vacuum preload (in a case wherein the ambience is at atmosphere or a reduced pressure ambience) or a magnet preload, or a confinement type load in which a preload is applied while a static-pressure bearing is disposed opposed.

Figure 2:
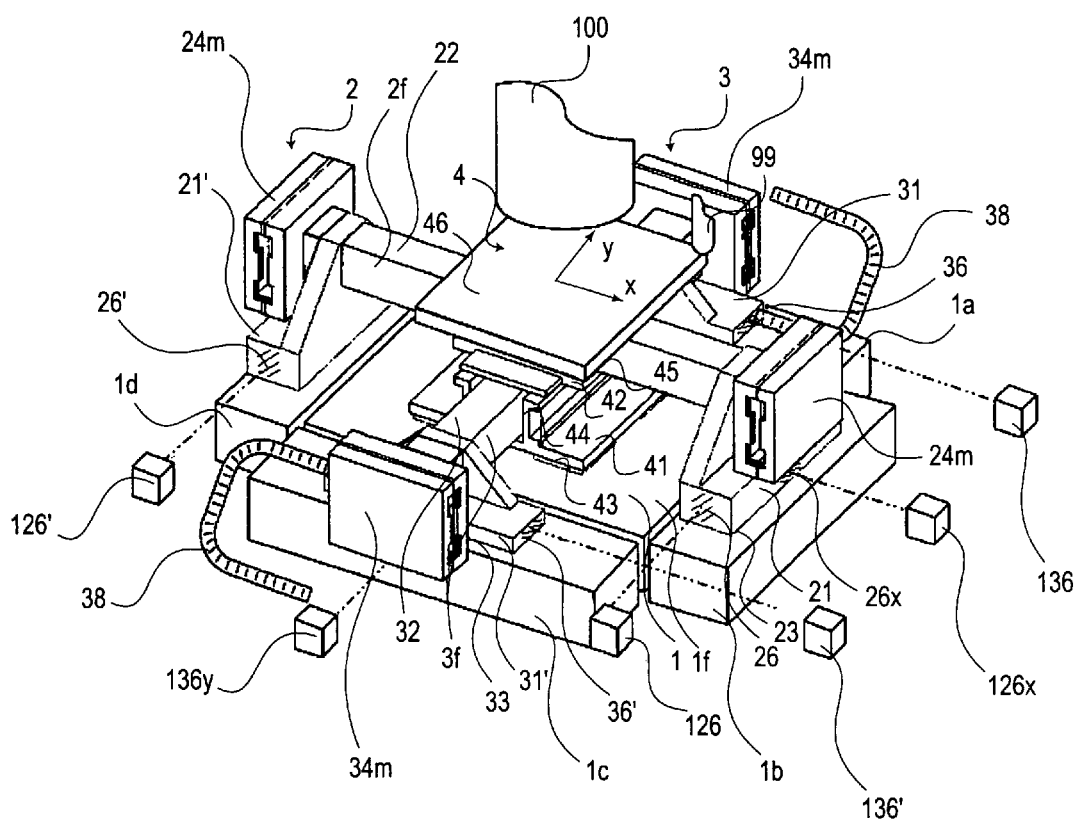
FIG. 2 is a perspective view of a main portion of a stage system in the FIG. 1 embodiment.

In this embodiment, since the system is used in a vacuum ambience, the simple float-type preload based on a magnet preload is used. In FIG. 6, denoted at 29 is a permanent magnet fixed to the Y foot, and denoted at 39 is a permanent magnet fixed to the X foot. Denoted at 49 is a permanent magnet fixed to the X-Y slider-(y) 41 (FIG. 2). These magnets are covered by magnetic shields 29sh, 39sh and 49sh, for preventing leakage of their magnetic shield. Since the confinement-type preload is not used, only the bearing surface and the guide surface are the precision required surface.

On the other hand, a structure such as a confinement-type preload is used as shown in FIG. 2, that is a vacuum-proof bearing 45 is provided at the opposite sides of the inside wall of the X-Y slider-(x) 42 to sandwich the opposed X guide 2f therebetween. On that occasion, regarding the precision required surface, the parallelism of the opposite sides of the bearing 45 at the X-Y slider side, as well as the parallelism of the opposite faces of the X guide 2f, should be controlled. However, the rigidity will be improved in this case.

Further, when permanent magnets are used in an electron beam exposure apparatus as in the present embodiment, in addition to covering each permanent magnet by use of a magnetic shield, the following measures may be done. That is, in FIG. 6A, the bases (1, 1a, 1b, 1c, 1d) of magnetic materials, which are the object to be attracted by the respective permanent magnets, are magnetically isolated from each other.

More specifically, the preload magnet 49 of the X-Y slider is disposed opposed to the stage base 1, and the preload magnet 29 of the Y slider is disposed opposed to the beam base 1*b* (1*d*). The preload magnet 39 of the X slider is disposed opposed to the beam base 1*a* (1*c*). The bases 1, 1*a*, 1*b*, 1*c* and 1*d* of them are disposed with a certain mutual magnetic resistance.

Figure 6C:
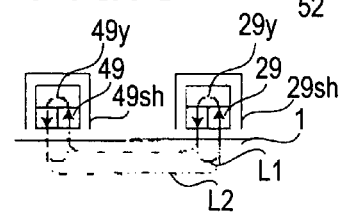
Figure 6D:
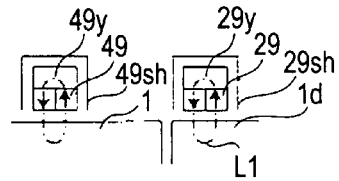

The effect of this structure will be explained, in conjunction with FIGS. 6C and 6D. FIG. 6C shows a case wherein the bases are not magnetically isolated, and FIG. 6D shows a case wherein the bases are isolated. If they are not isolated, in addition to magnetic circuits L1 produced by the respective magnets, a magnetic circuit L2 is produced between plural magnets and this leaks outwardly beyond the shields 29*sh*, 39*sh* and 49*sh*. On the other hand, if magnetic isolation is provided (that is, the magnetic resistance is enlarged sufficiently high), the magnetic flux leakage between plural magnets can be reduced as much as possible.

Figure 7:
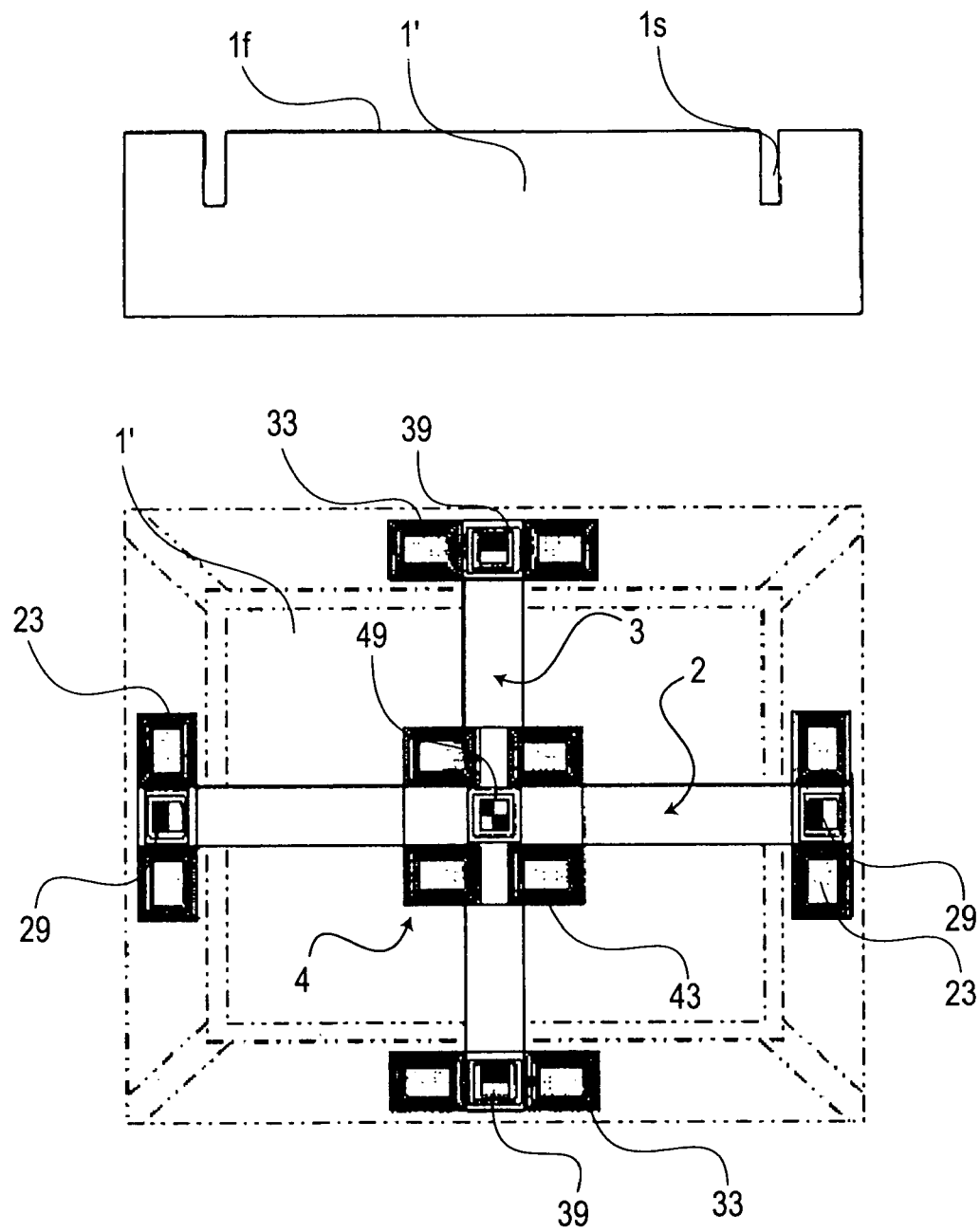
FIG. 7 is a schematic view for explaining another example of the base arrangement.

FIG. 7 illustrates the base arrangement according to a second embodiment, as viewed from the bottom. In FIG. 7, the base 1' to which the respective permanent magnets are disposed opposed is formed integrally. There is a slit 1*s* between movable regions of the sliders, to increase the magnetic resistance between plural magnets, such that magnetic flux leakage to be produced between plural magnets is minimized. In the arrangement of FIG. 7, the precision setting at the guide surface 1*f* of the base 1' is easy.

Figure 8A:
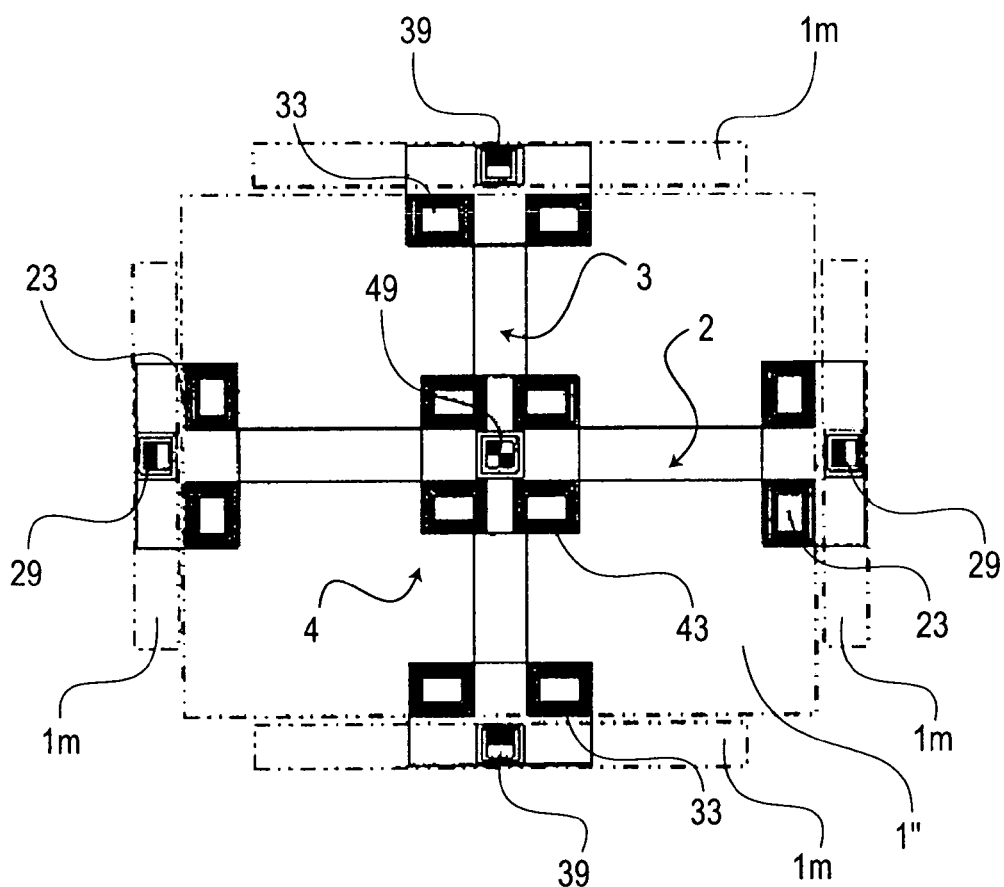
FIGS. 8A and 8B are schematic views, explaining a further example of the base arrangement.

FIG. 8A shows the base arrangement according to a third embodiment, as viewed from the bottom. In FIG. 8A, in the bottom pad movable region of each slider, a common base 1" and the magnetic material base 1*m* to which the permanent magnets 29 and 29 of the sliders 2 and 3 are magnetically isolated from each other.

Figure 8B:
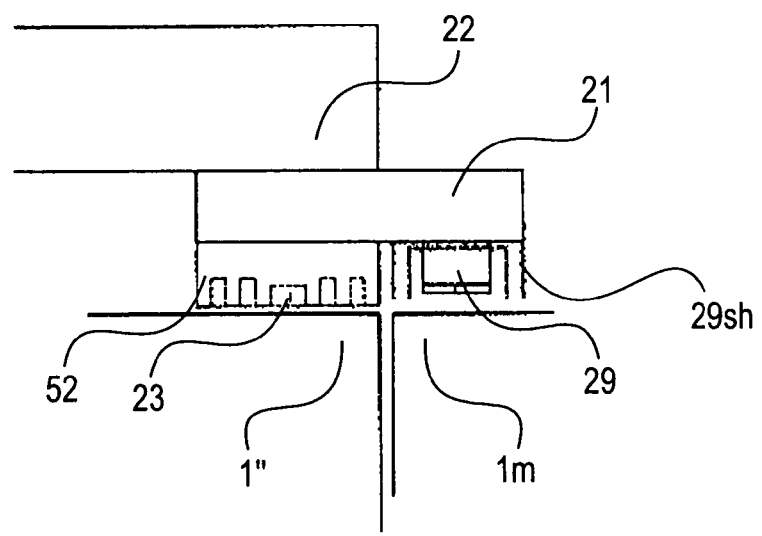

FIG. 8B illustrates the Y foot 21 as seen from the side thereof. The Y-bottom pad 23, including a labyrinth portion, uses the top face 1*f* of the common base 1" as a guide surface. The attracting permanent magnet 29 for applying a preload to the Y-bottom pad 23 and the magnetic shield 29*sh* are disposed opposed to the magnetic material base 1*m* being magnetically isolated from the common base 1", As shown in FIG. 8A, while the attracting magnet of the X-Y slider 4 is disposed opposed to the common base 1", since the common base 1" and the magnetic material base 1*m* are magnetically isolated from each other, magnetic flux leakage to be produced between plural magnets can be reduced as much as possible. Furthermore, generally, the flatness precision may be looser at the surface opposed to the permanent magnet than at the surface to be opposed to the bearing portion, and, therefore, the arrangement is advantageous with respect to machining and assembling.

Figure 9A:
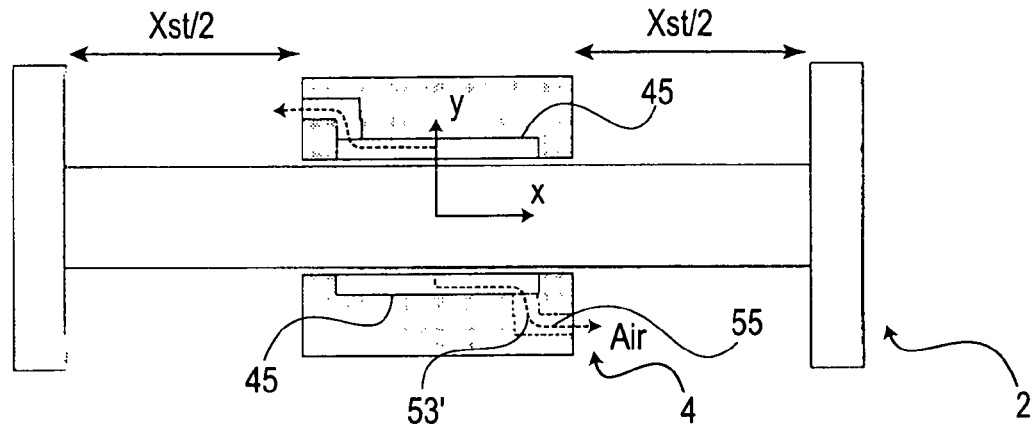
FIGS. 9A and 9B illustrate an exhaust system in the stage system of FIG. 2.
Figure 9B:
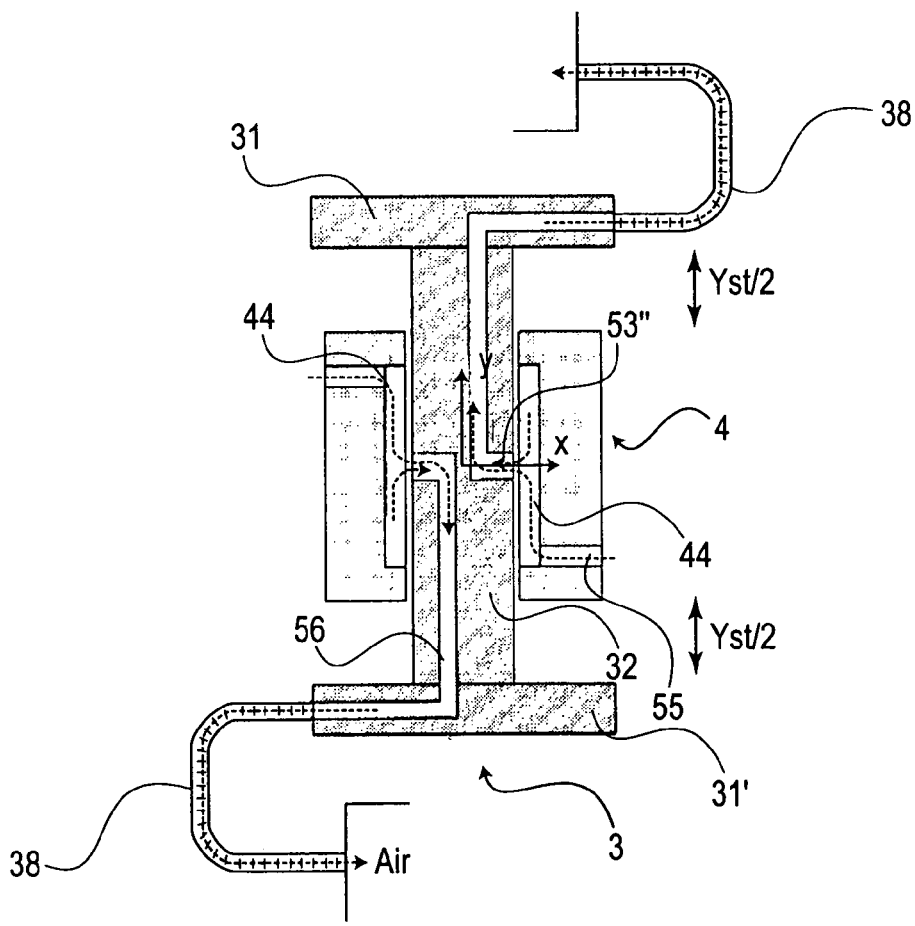
Figure 10:
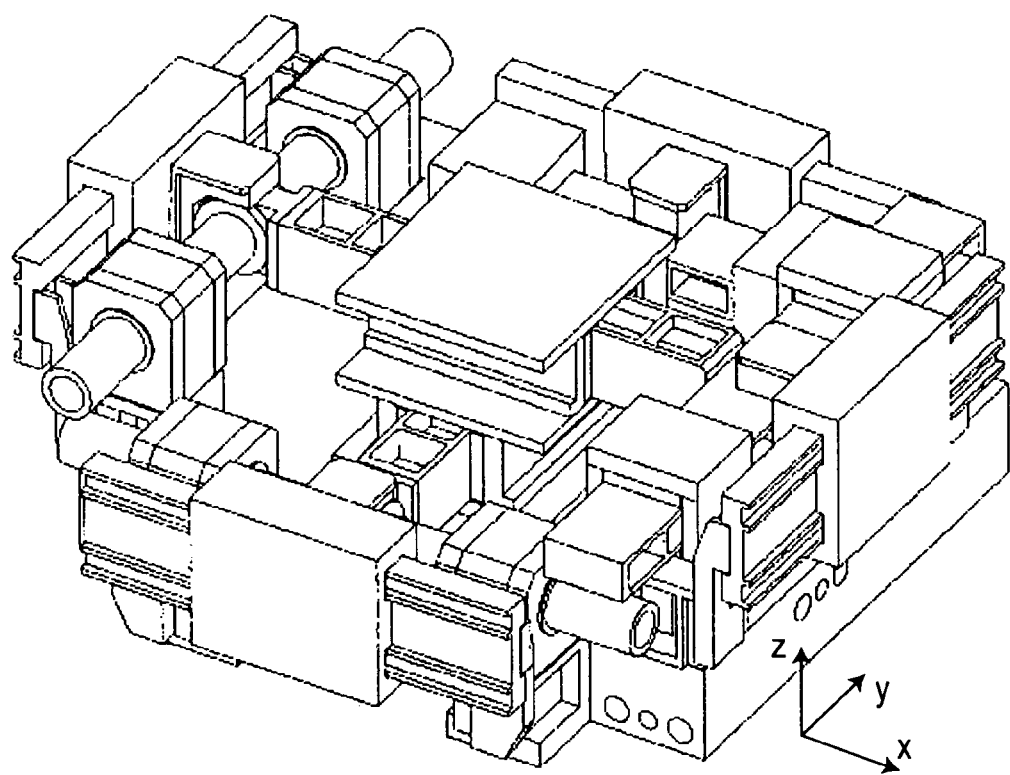
FIG. 10 is a perspective view of a stage system of a first conventional example.
Figure 11A:
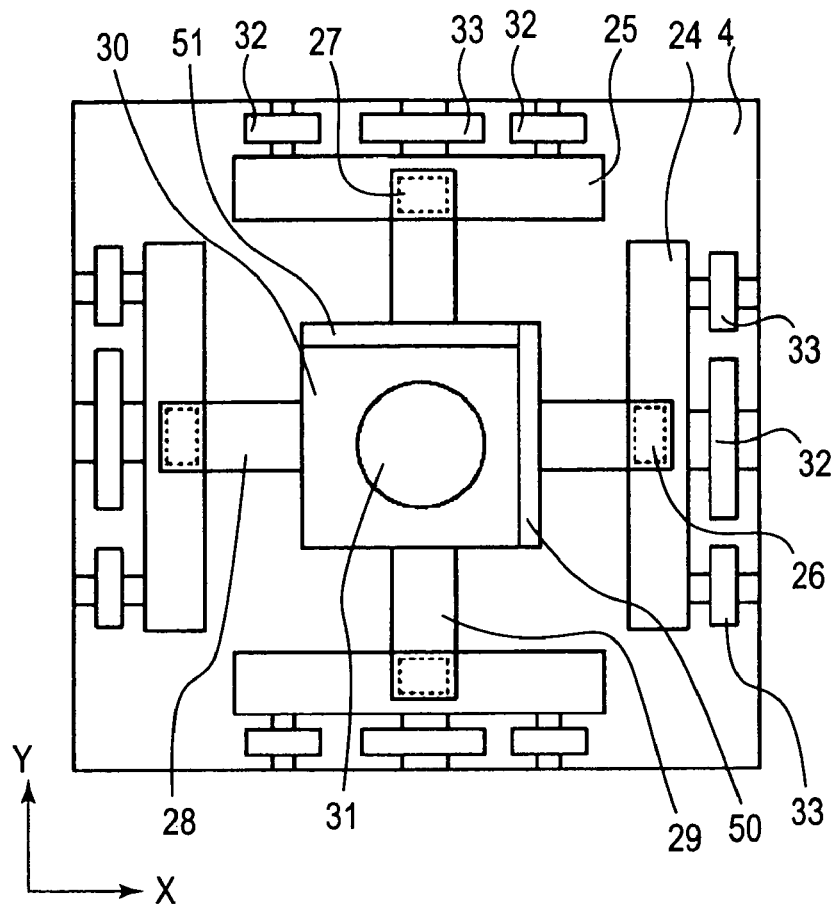
FIGS. 11A and 11B are schematic views, showing a stage system of a second conventional example.
Figure 11B:
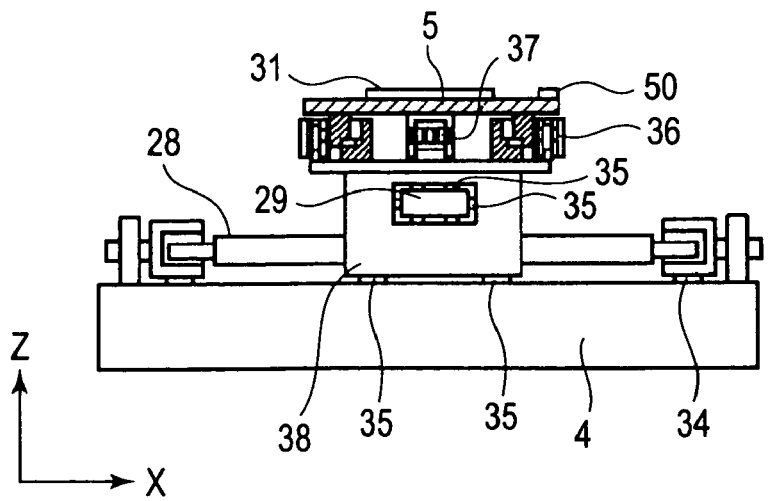
Figure 12:
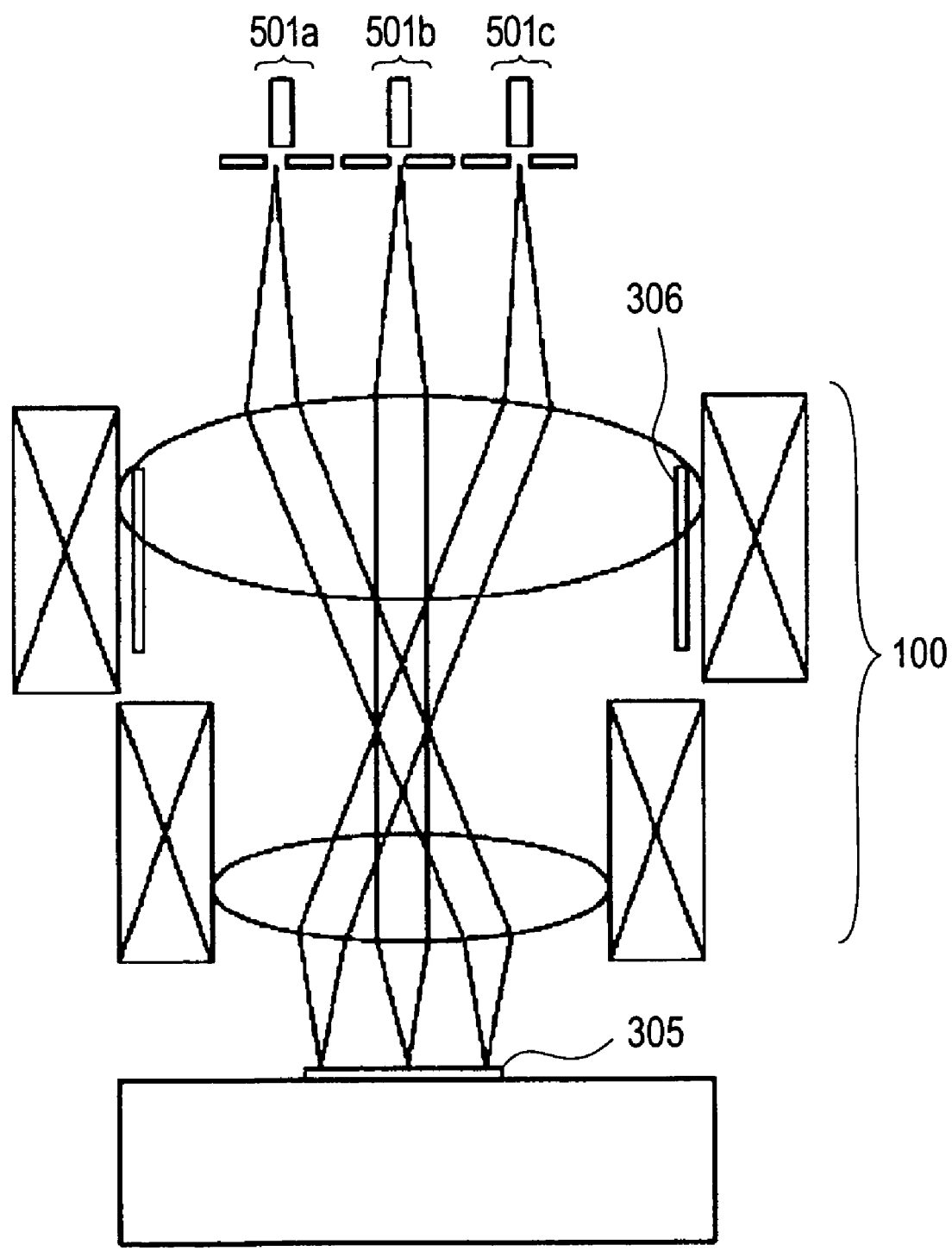
FIG. 12 is a schematic view of a general structure of a multiple electron-beam exposure apparatus.

FIGS. 9A and 9B are schematic views for explaining the flow of fluids collected by exhaust bores 53' and 53" of lateral pads 44 and 45 of the X-Y slider 4. In the electron beam exposure apparatus according to this embodiment of the present invention, as has been described with reference to FIGS. 1 and 2, an alignment scope 99 is disposed in the X direction such that, for observation of the whole surface of the wafer through the alignment scope, the top stage should have a stroke, just below the alignment scope, that corresponds to the wafer diameter. The distance from the center of the projection optical system to the alignment scope is called a "base line", and, in this arrangement, the X-direction stroke Xst is longer than the Y-direction stroke Yst by the base line (i.e., Xst>Yst). Thus, the following measures are taken, in this embodiment.

The fluid discharged from the Y lateral pad 45 is collected by the exhaust bore 53' formed in the labyrinth portion grooves 52*g* (FIG. 6). The collected fluid is discharged to the labyrinth portion groove 52*g* of the X lateral pad 44 through a pipe 55 provided in the X-Y slider 4 and the X lateral pad 44. The thus discharged fluid and the fluid discharged from the X lateral pad 44 are mixed with each other. The thus combined fluid is collected through an exhaust bore 53" formed in the X beam 32. The collected fluid is discharged outwardly of the vacuum sample chamber 300 (FIG. 1) through a pipe 56 formed in the X beam 32 and the X foot 31 (31') and from a flexible tube 38 connected to the X foot 31 (31').

The labyrinth portion groove 52*g* of the Y lateral pad 44 should have a length the same as or larger than the Y-direction stroke Yst. Although the X-direction stroke is still longer, since, in this embodiment, the fluid discharged from the X lateral pad 45 is collected at the X-Y slider 4 side, it is not necessary for the labyrinth portion groove 52*g* of the X lateral pad to have a length the same as the X-direction stroke Xst. Therefore, the size of the X-Y slider structure including the lateral pads 44 and 45 can be held to be small.

Next, semiconductor device manufacturing processes using an exposure apparatus described above, will be explained.

Figure 13:
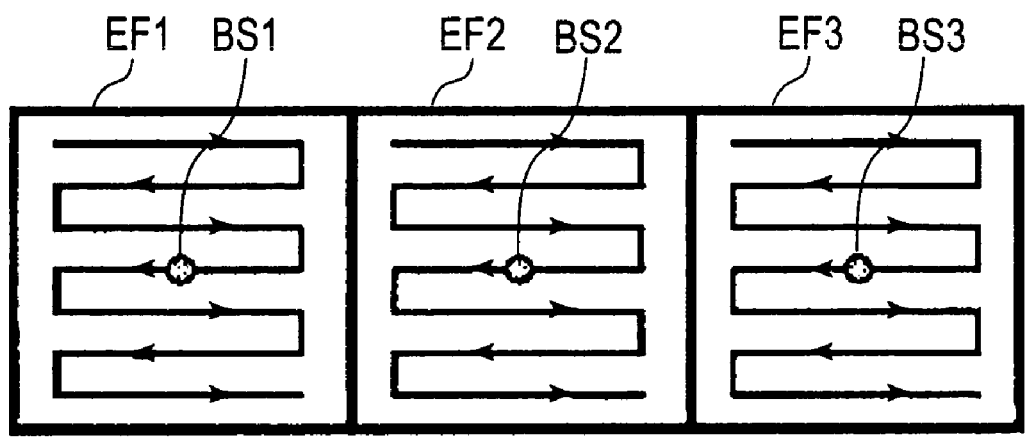
FIG. 13 is a schematic view for explaining the action as a wafer is scanned with a plurality of electron beams, in the exposure apparatus of FIG. 12.
Figure 13:
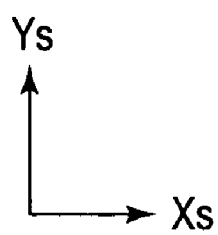
Figure 13:
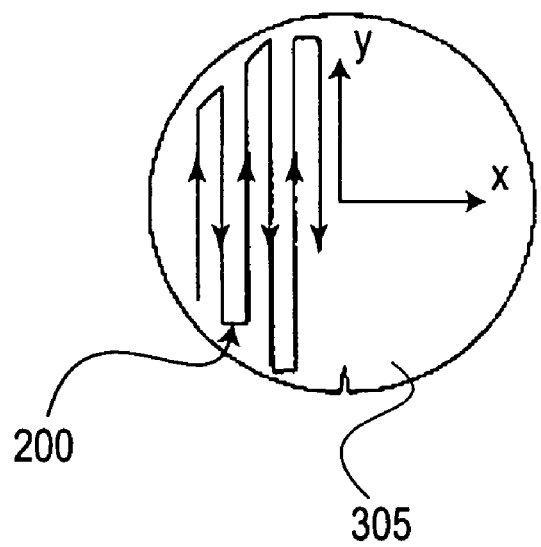
Figure 14:
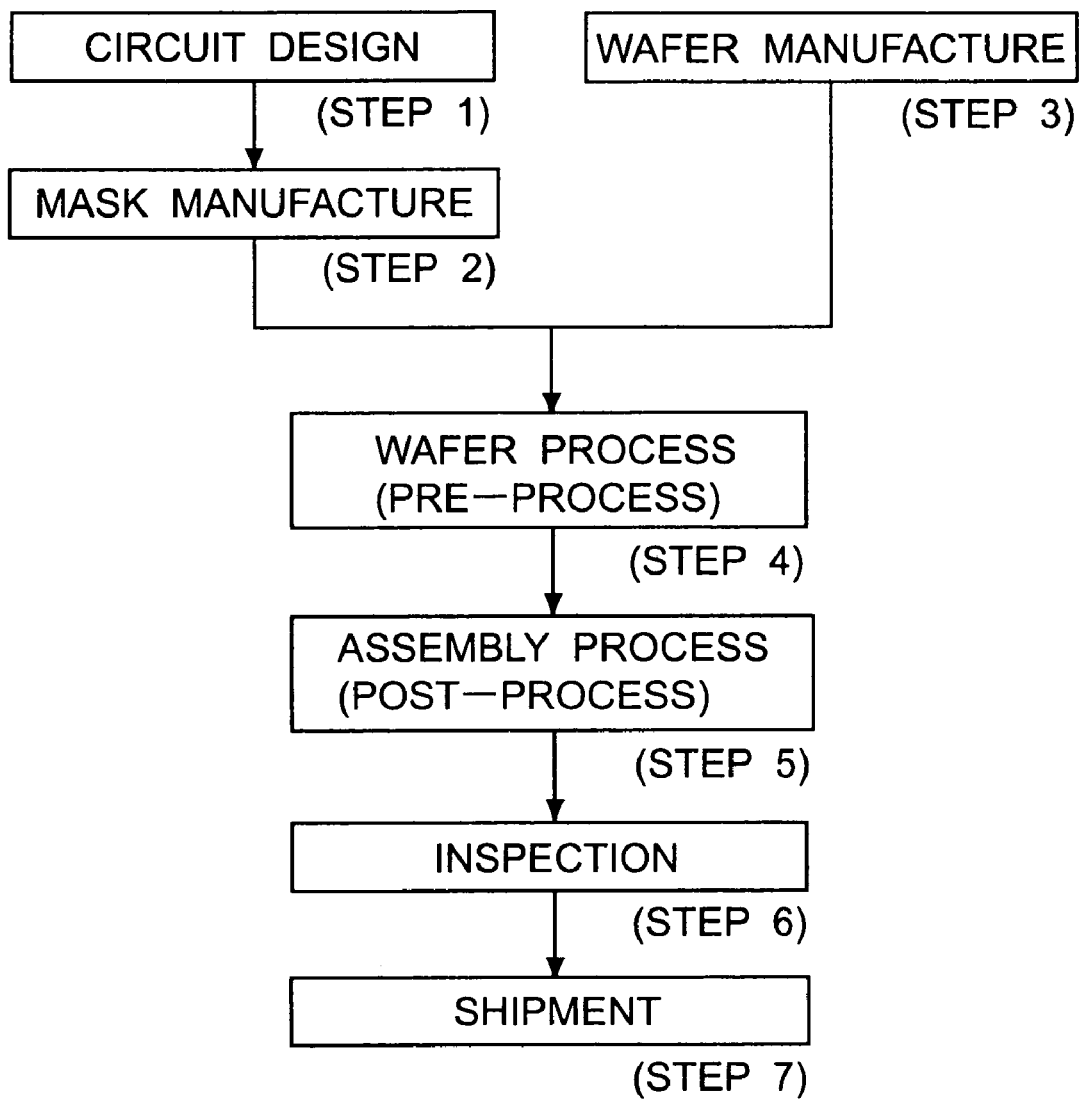
FIG. 14 is a flow chart for explaining device manufacturing processes.

FIG. 13 is a flow chart for explaining a general procedure for manufacturing semiconductor devices. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Step 4 described above includes an oxidation process for oxidizing the surface of a wafer, a CVD process for forming an insulating film on the wafer surface, an electrode forming process for forming electrodes upon the wafer by vapor deposition, an ion implanting process for implanting ions to the wafer, a resist process for applying a resist (photosensitive material) to the wafer, an exposure process for printing, by exposure, the circuit pattern of the mask on the wafer through the exposure apparatus described above, a developing process for developing the exposed wafer, an etching process for removing portions other than the developed resist image, and a resist separation process for separating the resist material remaining on the wafer after being subjected to the etching process. By repeating these processes, circuit patterns are superposedly formed on the wafer.

Although the foregoing description has been made with reference to examples in which the present invention is applied to an electron beam exposure apparatus, with appropriate modification of the structure, the present invention can be applied to a vacuum-ambience exposure apparatus that does not use an electron beam, for example, an EUV exposure apparatus in which EUV (extreme ultraviolet) light is used as exposure light. Furthermore, the stage of the present invention can be used not only in a vacuum, but also in a desired gas ambience.

If an electron beam is not used, since it is not necessary to consider the problem of a change in magnetic field in that case, there is no necessity of providing a magnetic shield to the linear motor or the permanent magnet. Further, it is unnecessary to magnetically isolate the base tables (bases) from each other.

On the other hand, even in an electron beam exposure apparatus, when the X slider and/or the Y slider is made on the basis of the confinement-type preload as described hereinbefore, it is not necessary to magnetically isolate the base tables from each other.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:
   a first fixed guide having a first guide surface being parallel to a first direction and a second direction being orthogonal to the first direction;
   a first movable guide to be guided by said first fixed guide and having three freedoms of straight motions in the first and second directions and a motion in a rotational direction about a third direction being orthogonal to the first and second directions, said first movable guide extending in the second direction;
   a second fixed guide having a second guide surface being parallel to the first and second directions;
   a second movable guide to be guided by said second fixed guide and having three freedoms of straight motions in the first and second directions and a motion in a rotational direction about the third direction, said second movable guide having a second guide extending in the first direction; and
   a movable member to be guided in the first and second directions by means of said first and second movable guides.

2. A stage system according to claim 1, further comprising (i) a first actuator group including a first actuator for driving said first movable guide in the first direction and with a relatively long stroke, and a second actuator for driving said first movable guide in the second direction and with a relatively short stroke, said first actuator group thus being operable to drive said first movable guide in directions of the three freedoms, and (ii) a second actuator group including a third actuator for driving said second movable guide in the second direction and with a relatively long stroke, and a fourth actuator for driving said second movable guide in the first direction and with a relatively short stroke, said second actuator group thus being operable to drive said second movable guide at least in two freedoms of the first and second directions.

3. A stage system according to claim 2, further comprising a third fixed guide for guiding said movable member, said third fixed guide having a third guide surface being parallel to the first and second directions.

4. A stage system according to claim 3, wherein said first, second and third guide surfaces are parallel to each other.

5. A stage system according to claim 4, wherein said first, second and third guide surfaces are defined by separating a single plane formed on an integral base member, by means of a groove.

6. A stage system according to claim 2, wherein each of said first to fourth actuators has a non-contact linear motor.

7. A stage system according to claim 1, further comprising (i) a first magnet for applying a preload to said first movable guide with respect to said first fixed guide, (ii) a second magnet for applying a preload to said second movable guide with respect to said second fixed guide, (iii) a third magnet for applying a preload to said movable member with respect to said third fixed guide, and (iv) magnetic shields for shielding said first, second and third magnets, respectively, wherein, in each of the magnetic shields, a magnetic resistance Re of a magnetic path formed inside the shield by a corresponding magnet and a corresponding magnetic shield is smaller than a magnetic resistance Rr of a magnetic path formed between the magnets.

8. A stage system according to claim 7, wherein each of said first to fourth actuators has a non-contact linear motor.

9. A stage system according to claim 6, wherein said first actuator drives said first movable guide by use of a magnetic flux component, in the second direction, of a first permanent magnet group that functions as a movable element in the first direction, while said second actuator drives said first movable guide by use of a magnetic flux component, in the first direction, of said first permanent magnet group, and wherein said third actuator drives said second movable guide by use of a magnetic flux component, in the first direction, of a second permanent magnet group that functions as a movable element in the second direction, while said fourth actuator drives said second movable guide by use of a magnetic flux component, in the second direction, of said second permanent magnet group.

10. A stage system according to claim 6, wherein each of said second and fourth actuators has an electromagnet.

11. An exposure apparatus including said stage system, as recited in claim 1, for positioning at least one of a substrate and an original.

12. A stage system, comprising:
    a first fixed guide having a first guide surface being parallel to a first direction and a second direction being orthogonal to the first direction;
    a first movable guide to be guided by said first fixed guide and extending in the second direction;
    a second fixed guide having a second guide surface being parallel to the first and second directions;
    a second movable guide to be guided by said second fixed guide and having a second guide extending in the first direction;
    a third fixed guide having a third guide surface being parallel to said first and second guide surfaces; and
    a movable member to be guided in the first and second directions by means of said first and second movable guides, and also to be guided by said third fixed guide in a third direction being orthogonal to the first and second directions,
    wherein said movable member is attracted to said third fixed guide by means of a permanent magnet unit having a magnetic shield.

13. A stage system according to claim 12, wherein an element to be guided by said stage system is supported with respect to the guides by means of a static pressure bearing system.

14. A stage system, comprising:
    a base table made of a magnetic material and having a plane parallel to a first direction and a second direction being orthogonal to the first direction;
    a first movable guide to be guided by the plane of said base table and extending in the second direction;
    a second movable guide to be guided by the plane of said base table and having a second guide extending in the first direction;

a movable member to be guided in the first and second directions by means of said first and second movable guides, and also to be guided by the plane of said base table in a third direction being orthogonal to the first and second directions;

first, second and third static pressure bearings for supporting said first and second movable guides and said central movable member, while maintaining a clearance between each of them and the plane of said base table;

first and second magnetic material bases each having a plane parallel to the first and second directions, said first and second magnetic material bases being disposed adjacent to one of said first and said second movable guide while being magnetically isolated from said base table;

first and second permanent magnets fixed to said first and second movable guides, respectively, and disposed opposed to planes of said first and second magnetic material bases, respectively, while a clearance is maintained between opposed surfaces;

a third permanent magnet fixedly provided adjacent to said third static pressure bearing of said movable member, while a clearance is maintained between said third permanent magnet and the plane of said base table; and magnetic shields for shielding said first, second and third permanent magnets, respectively.

15. A device manufacturing method comprising:
providing a stage system including:
(i) a first fixed guide having a first guide surface being parallel to a first direction and a second direction being orthogonal to the first direction;
(ii) a first movable guide to be guided by the first fixed guide and having three freedoms of straight motions in the first and second directions and a motion in a rotational direction about a third direction being orthogonal to the first and second directions, the first movable guide extending in the second direction;
(iii) a second fixed guide having a second guide surface being parallel to the first and second directions;
(iv) a second movable guide to be guided by the second fixed guide and having three freedoms of straight motions in the first and second directions and a motion in a rotational direction about the third direction, the second movable guide having a second guide extending in the first direction; and
(v) a movable member to be guided in the first and second directions by means of the first and second movable guides;

positioning at least one of a substrate and an original on the stage system; and manufacturing a device by exposing at least one of the substrate and the original positioned on the stage system.

* * * * *

UNITED STATES PATENT AND TRADEMARK OFFICE
CERTIFICATE OF CORRECTION

| | | |
|---|---|---|
| PATENT NO. | : 7,030,964 B2 | Page 1 of 1 |
| APPLICATION NO. | : 10/862383 | |
| DATED | : April 18, 2006 | |
| INVENTOR(S) | : Lawerence F. Becnel, Jr. | |

It is certified that error appears in the above-identified patent and that said Letters Patent is hereby corrected as shown below:

Col 10:, Line 48 surface.  Should read--surfaces. --

Signed and Sealed this

Seventeenth Day of October, 2006

JON W. DUDAS
*Director of the United States Patent and Trademark Office*